United States Patent [19]
Motonami et al.

[11] Patent Number: 5,280,444
[45] Date of Patent: Jan. 18, 1994

[54] DRAM COMPRISING STACKED-TYPE CAPACITOR HAVING VERTICALLY PROTRUDING PART AND METHOD OF MANUFACTURING THE SAME

[75] Inventors: Kaoru Motonami; Yoshinori Okumura, both of Hyogo, Japan

[73] Assignee: Mitsubishi Denki Kabushiki Kaisha, Tokyo, Japan

[21] Appl. No.: 851,409

[22] Filed: Mar. 13, 1992

[30] Foreign Application Priority Data

Apr. 1, 1991 [JP] Japan .................. 3-068638

[51] Int. Cl.$^5$ ............... G11C 13/00; G11C 11/24
[52] U.S. Cl. ..................... 365/149; 361/150
[58] Field of Search ............ 365/103, 149, 150; 437/52

[56] References Cited

U.S. PATENT DOCUMENTS 5,002,896  3/1991  Naruke .................. 365/103

FOREIGN PATENT DOCUMENTS

| 3918924A1 | 12/1989 | Fed. Rep. of Germany . |
| 4102184A1 | 8/1991 | Fed. Rep. of Germany . |
| 60-2784 | 1/1985 | Japan . |
| 61-55258 | 11/1986 | Japan . |
| 2-76257 | 3/1990 | Japan . |
| 2-96362 | 4/1990 | Japan . |
| 2-122560 | 5/1990 | Japan . |
| 2-260454 | 10/1990 | Japan . |

*Primary Examiner*—Terrell W. Fears
*Attorney, Agent, or Firm*—Lowe, Price, LeBlanc & Becker

[57] ABSTRACT

A storage node of a stacked capacitor in a DRAM comprises a first part connected to a source/drain region and a second part protruding upward from a substrate in a vertical wall shape. The second part includes a concave part in the inner part which is removed by etching. Steps are formed on the inner and outer peripheral surfaces of the vertical wall part. The steps are formed by a self-alignment method using a sidewall insulating layer formed by anisotropic etching. Capacitance of the capacitor is increased by forming steps on the surface of the storage node.

12 Claims, 23 Drawing Sheets

14

15

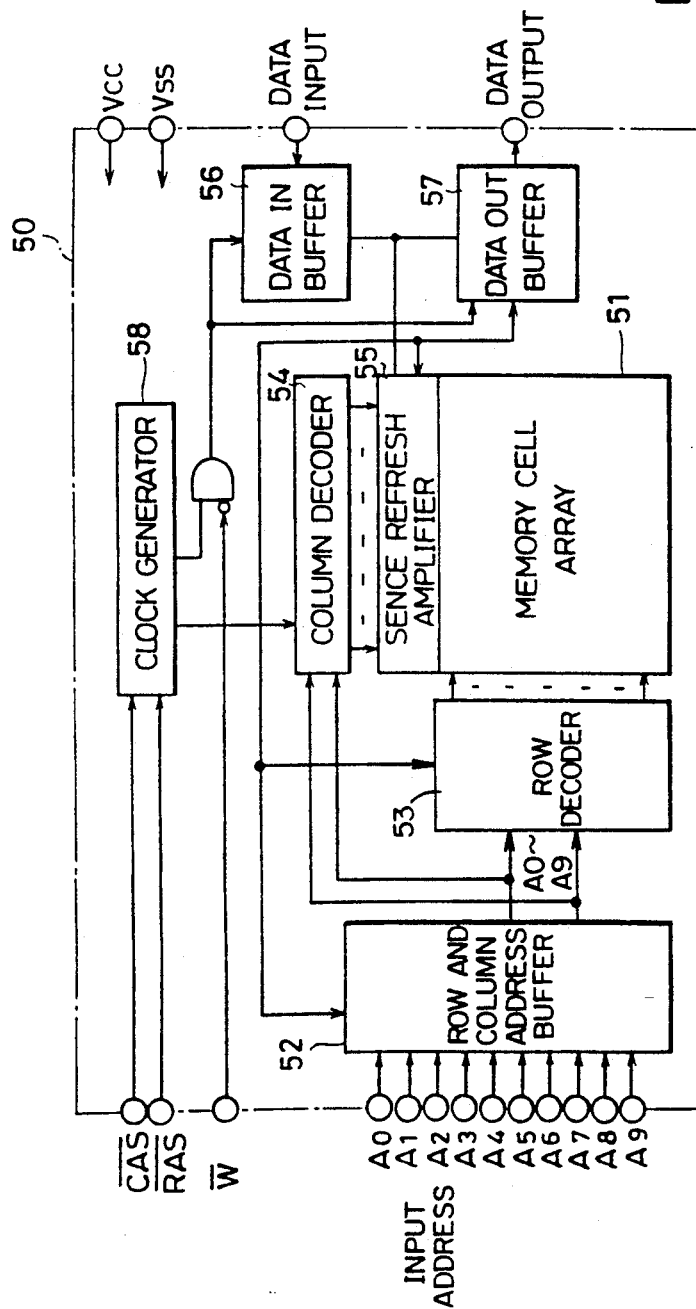
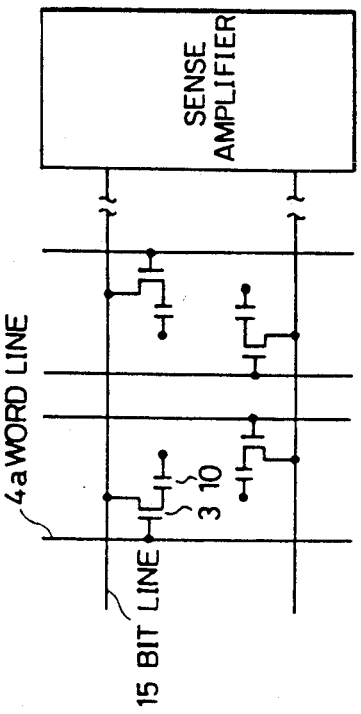
FIG. 34
FIG. 35

DRAM COMPRISING STACKED-TYPE CAPACITOR HAVING VERTICALLY PROTRUDING PART AND METHOD OF MANUFACTURING THE SAME

BACKGROUND OF THE INVENTION

1. Field of the Invention

The present invention relates to structure of capacitors which is capable of improving capacitance of stacked-type capacitors used in DRAMs in accordance with miniaturization of structure of DRAMs and a method of manufacturing the same.

2. Description of the Background Art

One type of semiconductor memory devices includes a DRAM (Dynamic Random Access Memory) which allows random input thereto and output therefrom of storage information. Generally, a DRAM includes a memory cell array which is a storage region storing a number of pieces of information and peripheral circuits necessary for input thereto and output therefrom from and to the outside. FIG. 34 is a block diagram illustrating a structure of a general DRAM. Referring to FIG. 34, a DRAM 50 includes a memory cell array 51 for storing data signals of storage information, a row and column address buffer 52 for receiving an address signal from a circuit for selecting a memory cell which constitutes a unit storage circuit, a row decoder 53 and a column decoder 54 for decoding the address signal to designate a memory cell, a sense refresh amplifier 55 for amplifying and reading the signal stored in the designated memory cell, a data in buffer 56 and a data out buffer 57 for input/output of data, and a clock generator 58 for generating a clock signal.

Memory cell array 51 occupying a large area on a semiconductor chip includes a plurality of memory cells for storing unit storage information arranged in a matrix. FIG. 35 is an equivalent diagram of four bits of memory cells included in memory cell array 51. The illustrated memory cell is what is called a one transistor one capacitor-type memory cell which includes one MOS (Metal Oxide Semiconductor) transistor and one capacitor connected to it. The structure of memory cells of this type is simple, so that the degree of integration of memory cell arrays can be easily enhanced by using them, and they are widely used in DRAMs having large capacity.

Memory cells in DRAMs can be divided into some types according to structure of capacitors. FIG. 36 is a sectional view of structure of a memory cell having a typical stacked-type capacitor, which is described in Japanese Patent Publication No. 60-27845 (1985) and so on, for example. Referring to FIG. 36, the memory cell includes one transfer gate transistor and one stacked-type capacitor (hereinafter referred to as a stacked-type capacitor). The transfer gate transistor includes a pair of source/drain regions 6, 6 formed in the surface of a silicon substrate 1 and a gate electrode (a word line) 4 formed on the surface of silicon substrate 1 with an insulating layer interposed. The stacked-type capacitor includes a lower electrode (a storage node) 11 extending from the upper part of gate electrode 4 to the upper part of a field isolating film 2 and having a part connected to one of source/drain regions 6, 6, a dielectric layer 12 formed on the surface of lower electrode 11, and an upper electrode (a cell plate) 13 formed on the surface of it. A bit line 15 is formed in the upper part of the capacitor with an interlayer insulating layer 20 interposed, and bit line 15 is connected through a bit line contact 16 to the other source/drain region 6 of the transfer gate transistor. The characteristic point of the stacked-type capacitor is that the area between the opposed electrodes of the capacitor is increased by extending the main part of the capacitor to the upper parts of the gate electrode and the field isolating film to secure desired capacitance of the capacitor.

Generally, capacitance of a capacitor is directly proportional to the area between opposed electrodes and inversely proportional to the thickness of dielectric layer. Accordingly, it is desirable that the area between the opposed electrodes of a capacitor is increased to increase capacitance of a capacitor. On the other hand, the size of a memory cell has been largely reduced in accordance with large scale integration of a DRAM. Therefore, the flat occupied area of a capacitor forming region has also been reduced. However, it is not possible to reduce the amount of electric charge which can be stored in a memory cell of one bit in consideration of stable operation or reliability of DRAM as a memory device. In order to satisfy such directly-opposed conditions, various types of improvements in a structure of a capacitor capable of reducing the flat occupied area of a capacitor and increasing the area between opposed electrodes are proposed.

FIG. 37 is a cross sectional view of a structure of a memory cell including a stacked-type capacitor disclosed in JP2-122560, for example. Referring to FIG. 37, a transfer gate transistor 3 includes a gate electrode 4 having its periphery covered with an insulating layer 22, a pair of source/drain regions 6, 6, and a gate oxide film 5. A stacked-type capacitor 10 includes a lower electrode 11, a dielectric layer 12, and an upper electrode 13. Lower electrode 11 includes a base part 11a formed on the surfaces of insulating layers 22, 22 covering gate electrodes (word lines) 4, 4 and a projecting part 11b extending from the surface of base part 11a upward. Dielectric layer 12 and upper electrode 13 are sequentially layered on the surface of lower electrode 11. The illustrated stacked-type capacitor uses the surface of projecting part 11b of lower electrode 11 as an charge storage region. Projecting part 11b makes it possible to increase the capacitance of the capacitor without increasing the plane occupied area of the capacitor.

FIGS. 38-42 are cross sectional views illustrating structure of the memory cell illustrated in FIG. 37 in a main manufacturing process.

First, referring to FIG. 38, a polycrystalline silicon layer is formed on the whole surface of a substrate, and then, impurities are introduced thereinto. Etching is carried out using a resist pattern 30 as a mask to form a lower electrode 110a.

Then, referring to FIG. 39, resist pattern 30 is removed, and then, a polycrystalline silicon layer 110b is formed on the whole surface. Impurities of a low concentration are introduced from lower electrode 110a into polycrystalline silicon layer 110b.

Then, referring to FIG. 40, anisotropic etching is carried out on polycrystalline silicon layer 110b and lower electrode 110a by RIE. In the etching process, first, anisotropic etching is carried out on polycrystalline silicon layer 110b to leave polycrystalline silicon layer 110b only on the side surfaces of the lower electrode. Then, lower electrode 110a is sequentially etched from the upper surface. The etching is ended when lower electrode 110a has been etched to have a predetermined thickness. Base part 11a and projecting part 11b of lower electrode 11 are formed by those steps.

Then, referring to FIG. 41, a dielectric layer 12 and an upper electrode 13 are formed on the surface of the lower electrode.

However, base part 11a and projecting part 11b of lower electrode 11 in the stacked-type capacitor are formed by different steps. Accordingly, a seam is formed on the boundary between base part 11a and projecting part 11b. A natural oxide film is liable to form on the seam after formation of base part 11a. Therefore, there is a case where electric conduction between base part 11a and projecting part 11b is prevented by the natural oxide film, so that projecting part 11b does not function as a lower electrode of the capacitor.

The upper surface of projecting part 11b on which anisotropic etching has been carried out is illustrated as flat in FIGS. 39 and 40. However, according to the inventor's knowledge, the etched upper surface of projecting part 11b is formed in a shape in which the inner peripheral side is sharp as illustrated in FIG. 42. If such a sharp angular part is formed, electric field concentration occurs in that part to cause a problem of dielectric breakdown of dielectric layer 12.

SUMMARY OF THE INVENTION

An object of the present invention is to increase electric charge storing capacitance of a stacked-type capacitor.

Another object of the present invention is to increase electric charge storing capacitance of a capacitor by enlarging the area of the surface of a lower electrode layer in a stacked-type capacitor.

Still another object of the present invention is to enhance completeness of covering by a dielectric layer in a capacitor.

A further object of the present invention is to provide a method of manufacturing capable of integrally forming a lower electrode of a stacked-type capacitor.

Another object of the present invention is to provide a method of manufacturing a capacitor having a vertically protruding part.

According to a first aspect of the present invention, a DRAM includes a semiconductor substrate of a first conductivity-type including an impurity region of a second conductivity-type formed therein and an insulating layer formed on a main surface of the semiconductor substrate and having an opening which reaches the impurity region. A capacitor is formed on the surface of the insulating layer. The capacitor includes a lower electrode layer, a dielectric layer formed on the surface of the lower electrode layer, and an upper electrode layer formed on the surface of the dielectric layer. The lower electrode of the capacitor includes a first part formed along the surface of the insulating layer to be connected through the opening to the impurity region and a second part integrally formed protruding upward from the surface of the first part to surround the side surfaces of a space whose section taken along a line perpendicular to the main surface of the semiconductor substrate has an axially symmetrical configuration.

According to a second aspect of the present invention, the second part of the lower electrode layer of the capacitor in a DRAM is formed so that its thickness in a direction parallel to the main surface of the semiconductor substrate changes stepwise.

The first part and the second part of the lower electrode of the capacitor are integrally formed. Therefore, formation of an insulating seam part between the first part and the second part is prevented, so that it is possible to effectively utilize the whole of the lower electrode as an electrode of the capacitor. In addition, the area of the capacitance part of the capacitor is enlarged by forming steps in the second part protruding vertically upward from the surface of the substrate, so that capacitance of the capacitor can be increased.

According to a third aspect of the present invention, a DRAM comprises a stacked capacitor connected to an impurity region formed on a main surface of a semiconductor substrate, and a method of manufacturing the same comprises the following steps.

First, a first insulating layer is formed on a main surface of a semiconductor substrate including an impurity region formed therein to have an opening which reaches the impurity region. Next, a first conductive layer is formed on the surface of the first insulating layer and in the opening. An opening region which reaches the first insulating layer is formed on the periphery of the region to be a lower electrode of one stacked capacitor of the first conductive layer. Then, an insulating layer is formed in the opening region. The first conductive layer is etched so that the upper part of the second insulating layer protrudes from the surface of the first conductive layer. Then, a sidewall insulating layer is formed on the sidewall of the second insulating layer protruding from the surface of the first conductive layer. The first conductive layer is etched using the sidewall insulating layer as a mask, and a concave part is formed in the inner part of the first conductive layer. The second insulating layer and the sidewall insulating layer are removed, and then a dielectric layer is formed on the surface of the first conductive layer. A second conductive layer is formed on the surface of the dielectric layer.

According to a fourth aspect of the present invention, a method of manufacturing DRAM includes the following steps.

First, a first insulating layer is formed on a main surface of a semiconductor substrate including an impurity region formed therein to have an opening which reaches the impurity region. Next, a first conductive layer is formed on the surface of the first insulating layer and in the opening. Then, an opening region which reaches the first insulating layer is formed on the periphery of the region of the first conductive layer to be a lower electrode of one stacked capacitor. Then, a mask layer for etching is selectively formed on the surface of the first conductive layer surrounded by the opening region. The first conductive layer is etched using the mask layer for etching as a mask to form a concave part on the surface of the first conductive layer. Then, a dielectric layer is formed on the surface of the first conductive layer. A second conductive layer is formed on the surface of the dielectric layer.

In the method of manufacturing the DRAM, the mask layer formed on the surface of the first conductive layer may be formed either by using a mask pattern formed using a lithography or by using a pattern of an insulating layer using a sidewall insulating layer formed in a self-alignment manner by an anisotropic etching. In the latter case, all the steps of forming a concave part in the inner part of the first conductive layer may be carried out in a self-alignment manner.

Specifically, in the method of manufacturing DRAM, a thick first conductive layer to be the lower electrode of the capacitor is formed, and then the first part is formed by forming the concave part in the inner part of the first conductive layer in a self-alignment manner using the sidewall insulating layer as a mask. By using such steps, it is possible to define the final configuration of the lower electrode of the capacitor by an etching method. It is possible to repeatedly carry out the step of etching. As a result, it is possible to form a plurality of steps on the inner surface or the outer surface of the first conductive layer constituting the lower electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 34 is a block diagram illustrating a structure of a general DRAM.

FIG. 35 is an equivalent circuit diagram of a memory cell in a general DRAM.

DESCRIPTION OF THE PREFERRED EMBODIMENTS

Figure 2:
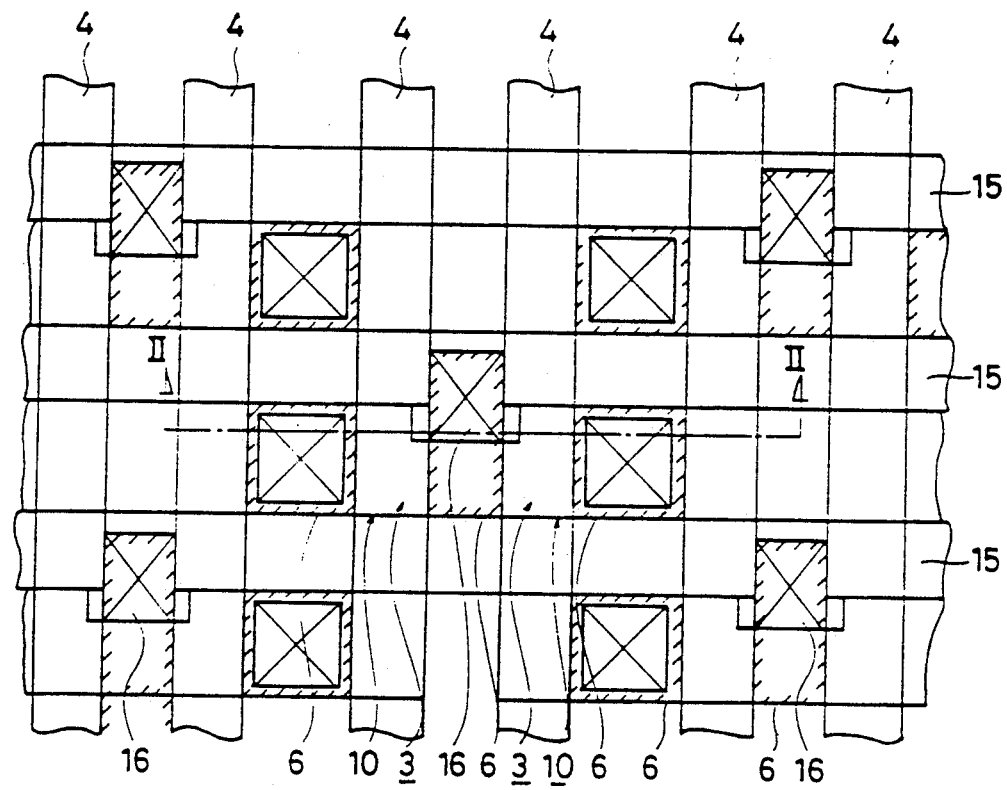
FIG. 2 is a plan view of a structure of the memory cell illustrated in FIG. 1.

First, mainly referring to FIG. 2, a plurality of gate electrodes (word lines) 4 extending parallel to one another in the row direction, a plurality of bit lines 15 extending parallel to one another in the column direction, and a plurality of memory cells arranged in the vicinity of crossings of word lines 4 and bit lines 15 are formed on the surface of a silicon substrate 1.

Figure 1:
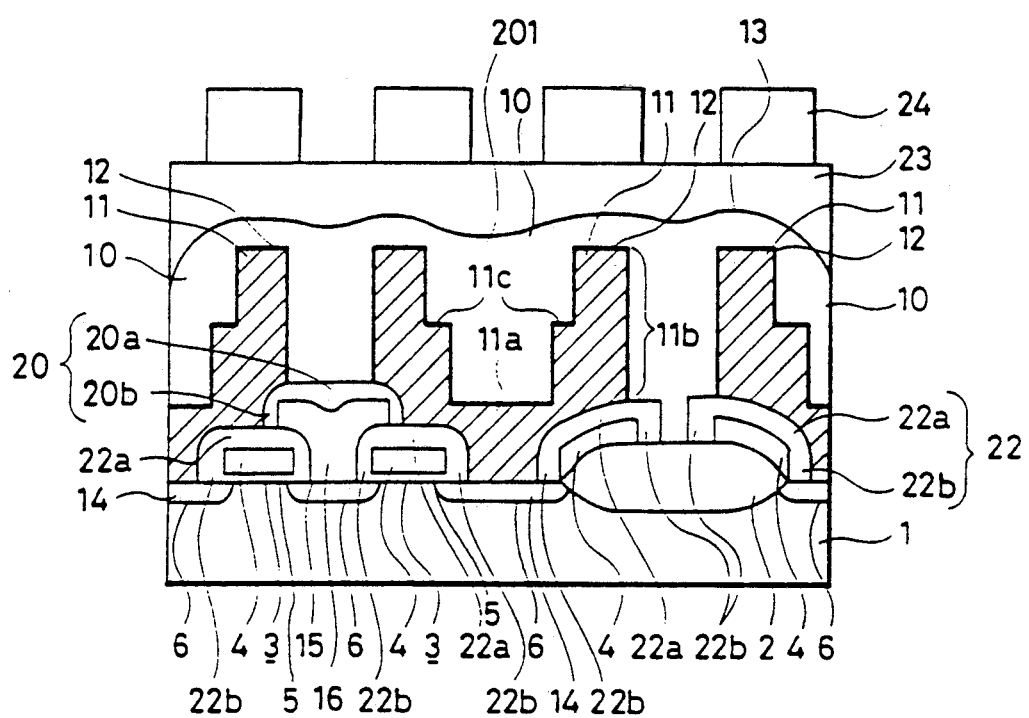
FIG. 1 is a sectional view of a structure of a memory cell in a DRAM according to a first embodiment of the present invention.

Referring to FIGS. 1 and 2, a memory cell includes one transfer gate transistor 3 and one capacitor 10. These elements adjacent to each other are insulated and isolated by a field isolating film 2. Transfer gate transistor 3 includes a pair of source/drain regions 6, 6 formed in the surface of silicon substrate 1 and a gate electrode (a word line) 4 formed on the surface of silicon substrate 1 between them with a gate insulating film 5 interposed. The periphery of gate electrode 4 is covered with an insulating layer 22 including an upper insulating layer 22a and sidewall insulating layers 22b.

Next, bit line 15 is connected through a bit line contact 16 to one source/drain region 6 of transfer gate transistor 3. Bit line 15 is formed at a level lower than the level of the upper end of capacitor 10, and the periphery of it is covered with an insulating layer including an upper insulating layer 20a and sidewall insulating layers 20b.

Figure 33:
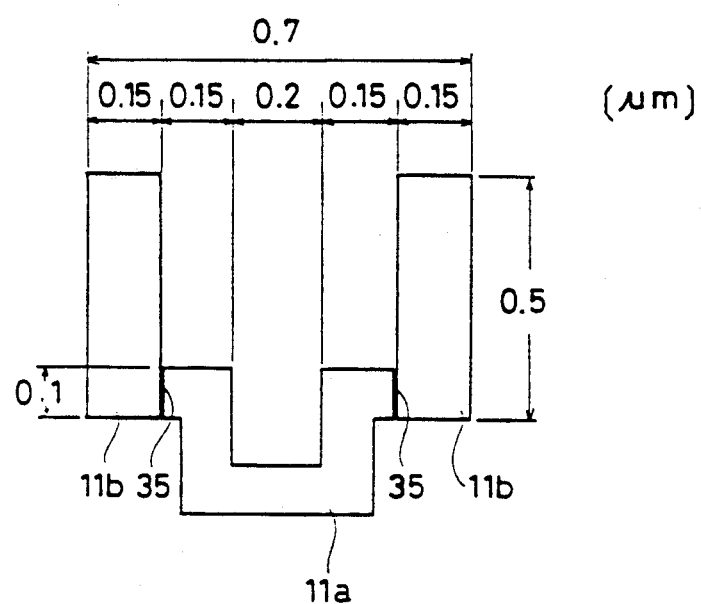
FIG. 33 is a model diagram of a capacitor used in a comparison test for the capacitance of a capacitor.
Figure 36:
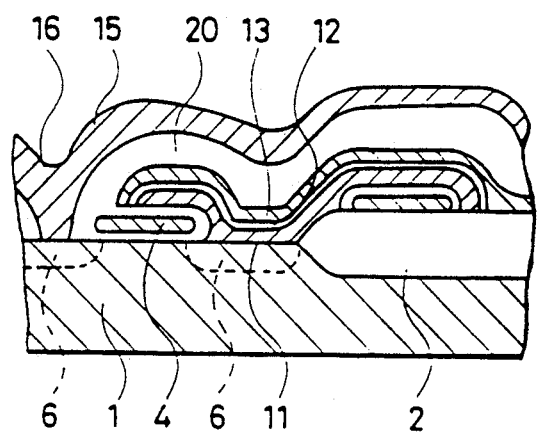
FIG. 36 is a sectional view of a structure of a memory cell comprising a stacked-type capacitor in a DRAM showing a conventional example.
Figure 37:
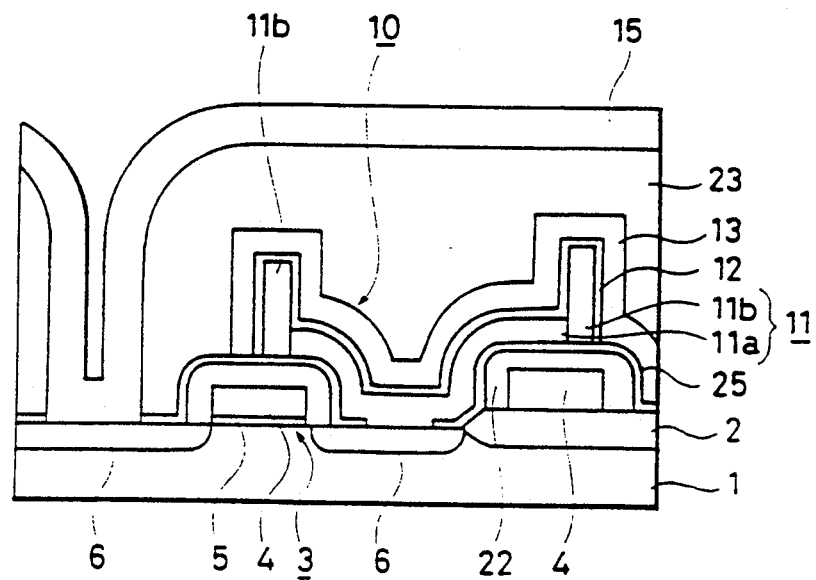
FIG. 37 is a sectional view of a structure of a memory cell in a DRAM showing another conventional example.
Figure 38:
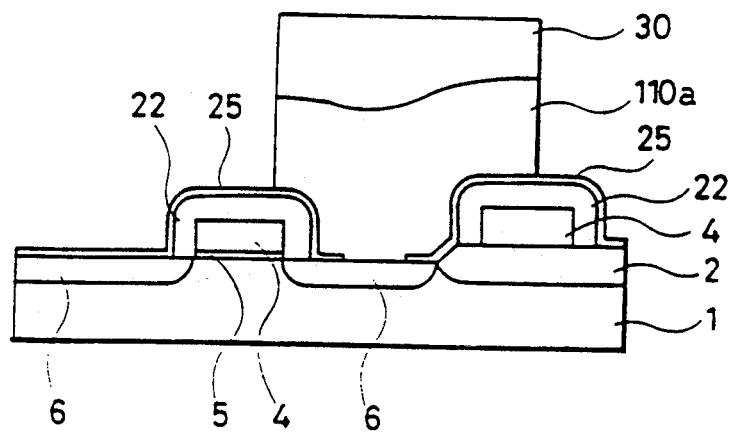
FIGS. 38-42 are sectional views of the structure of the memory cell illustrated in FIG. 37 illustrating sequential steps of manufacturing the memory cell.
Figure 39:
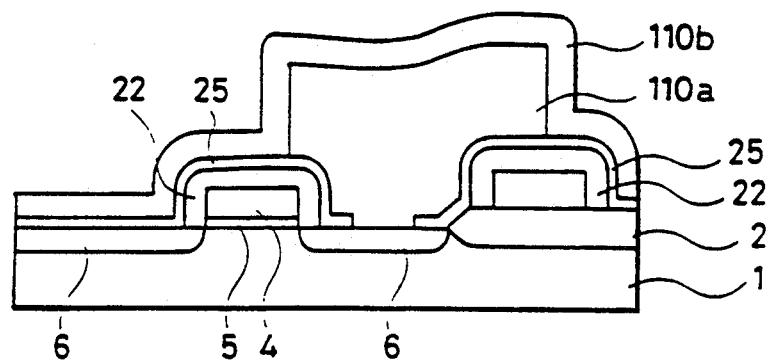
Figure 40:
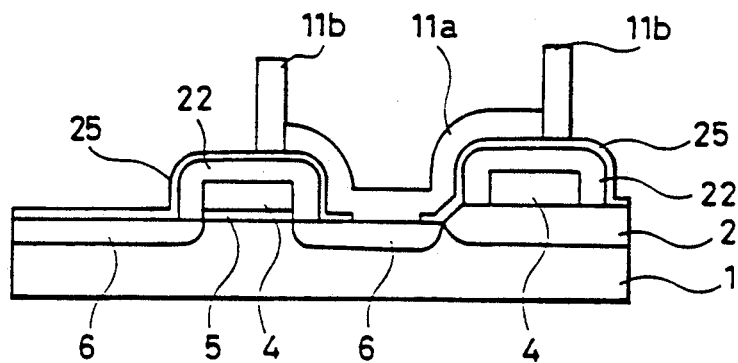
Figure 41:
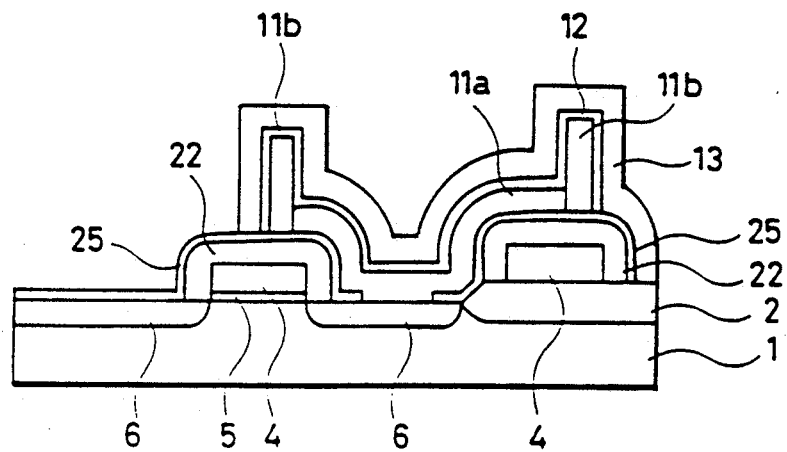
Figure 42:
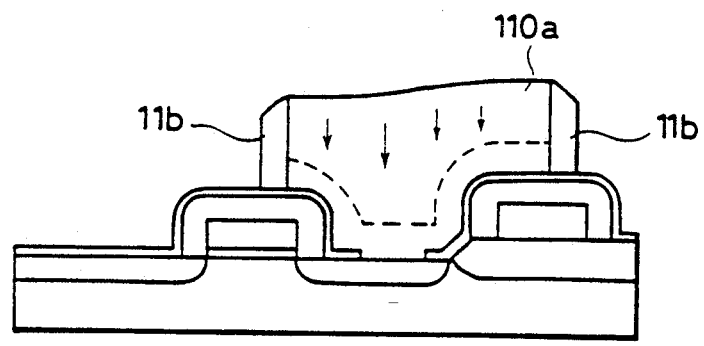

Capacitor 10 includes a lower electrode (a storage node) 11, a dielectric layer 12, and an upper electrode (a cell plate) 13. Lower electrode 11 may be divided into two parts for convenience of explanation. A first part 11a of lower electrode 11 is connected through a contact hole 14 to the source/drain region 6 opposed to the source/drain region to which bit line 15 is connected through a bit line contact 16 and extends on the upper part of word line 4 or bit line 15 with insulating layers 22a, 22b, 20a, and 20b interposed. A second part 11b of lower electrode 11 protrudes from the surface of the first part 11a in an approximately vertically upward direction in a vertical wall shape. The upper surface of second part 11b and the surface of the step part 11c are formed to be approximately parallel to the surface of the substrate and to be flat. A concave part 201 is formed in the central part of the second part 11b by using an etching method as described in the following. In other words, second part 11b is formed to surround the sidewall surface of concave part 201. A step surface 11c is formed on the inner periphery of second part 11b. First part 11a and second part 11b of lower electrode 11 are integrally made from the same material. Accordingly, it is possible to utilize the whole of lower electrode 11 completely as an electrode of the capacitor as compared with the conventional capacitor in which first part (base part) 11a and second part (projecting part) 11b of lower electrode 11 are formed in different manufacturing steps. The inventor compared the capacitance of the conventional capacitor and that of the capacitor according to the present invention using a capacitor as illustrated in FIG. 33. The conventional-type capacitor has a seam part 35 formed between first part 11a and second part 11b, while the capacitor according to the present invention has first part 11a and second part 11b formed integrally. If the dielectric layer is converted into an oxide film, it has a thickness $t_{off}$ of 4 nm. Second part 11b is formed in a cylindrical shape. As the result of the comparison test, the capacitance of the conventional-type capacitor was C=2.8 fF, and the capacitance of the capacitor according to the present invention was C=21.6 fF. According to this result, the conventional-type capacitor has first part 11a and second part 11b insulated by seam part 35, so that second part 11b does not function as a lower electrode. On the other hand, second part 11b of the capacitor according to the present invention functions sufficiently as a lower electrode. Concave part 201 of second part 11b may be formed in any stepped configuration formed by an etching method. It is possible to utilize the whole of the outer peripheral surface and the inner peripheral surface of second part 11b as a region of capacitance of the capacitor. The configuration of the outer peripheral surface can be set independent of the inner peripheral surface of the second part or the configuration of the surface of the first part, so that it becomes easy to set capacitance of the capacitor.

An oxide film or a composite film of an oxide film and a nitride film or the like is used for forming dielectric layer 12. Upper electrode 13 is made from polycrystalline silicon and so on. An interlayer insulating layer 23 is formed on the surface of upper electrode 13, and an interconnecting layer 24 is arranged on the surface of it.

Next, sequential manufacturing steps of a sectional structure of the memory cell illustrated in FIG. 1 will be described.

Figure 3:
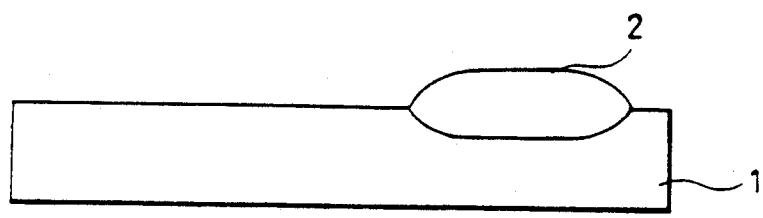
FIGS. 3-19 are sectional views of the structure of the memory cell illustrated in FIG. 1, illustrating sequential steps of manufacturing the memory cell.

First, as illustrated in FIG. 3, a field oxide film 2 for isolating elements and a channel stop region (not shown) are formed in predetermined regions on a main surface of a silicon substrate 1.

Figure 4:
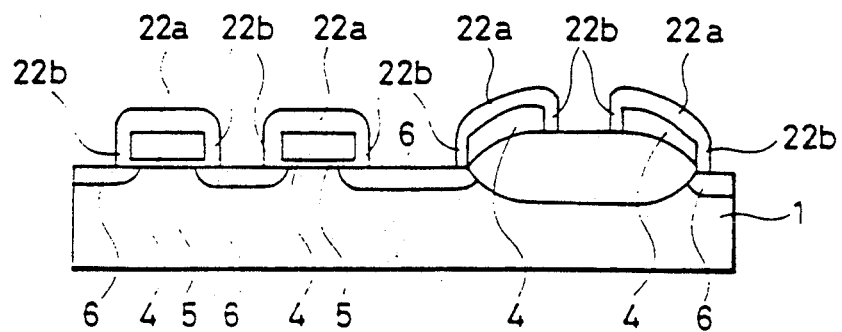

Next, as illustrated in FIG. 4, a heat oxidation film, a polycrystalline silicon layer formed by a CVD (Chemical Vapor Deposition) method, and an insulating layer such as an oxide film are formed on the surface of silicon substrate 1, and a word line 4, an upper insulating layer 22a and a gate insulating film 5 are formed by using a photolithography method and an etching method. Furthermore, an oxide film is deposited on the whole surface by using a CVD method, and then sidewall insulating layers 22b are formed by an anisotropic etching. Subsequently, ion implantation of a n-type impurity is carried out in the surface of silicon substrate 1 using word line 4 covered with insulating layers 22a and 22b as a mask to form a pair of source-drain regions 6, 6.

Figure 5:
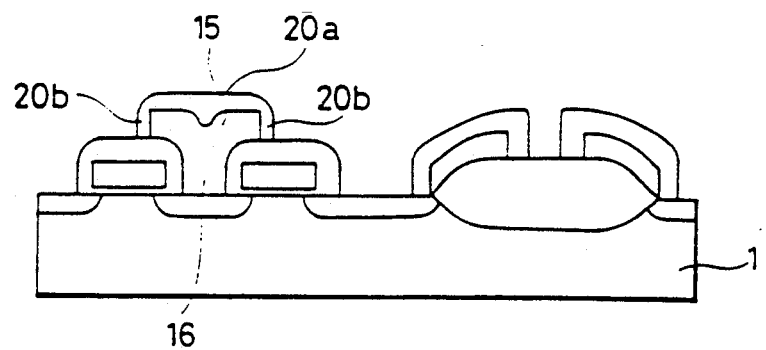

Referring to FIG. 5, a conductive layer, for example, a doped polycrystalline silicon layer, a metal layer, or a metal silicide layer is formed on the whole of the surface of silicon substrate 1. An insulating layer including an oxide film, a nitride film, or layered films of an oxide film and a nitride film is formed on the surface of it. Then, the insulating layer and the conductive layer are patterned by using a photolithography method and an etching method to form a bit line 15 and an upper insulating layer 20a. An insulating layer such as an oxide film or a nitride film is deposited on the whole surface, and sidewall insulating layers 20b are formed on the sidewalls of bit line 15 by anisotropic etching.

Figure 6:
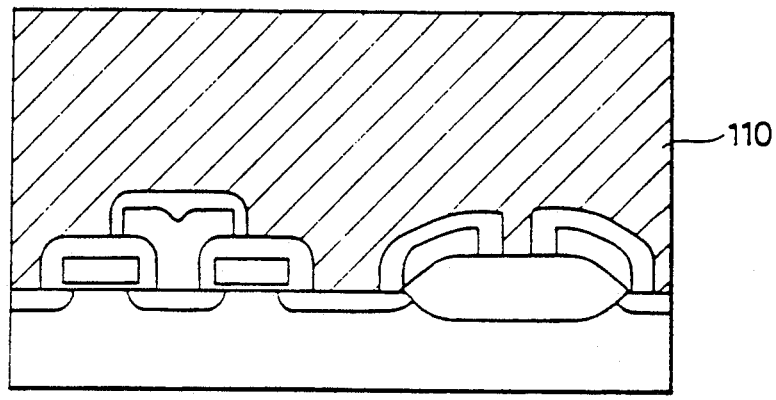

As illustrated in FIG. 6, a polycrystalline silicon layer 110 is thickly deposited on the whole of the surface of silicon substrate 1 by using a CVD method.

Figure 7:
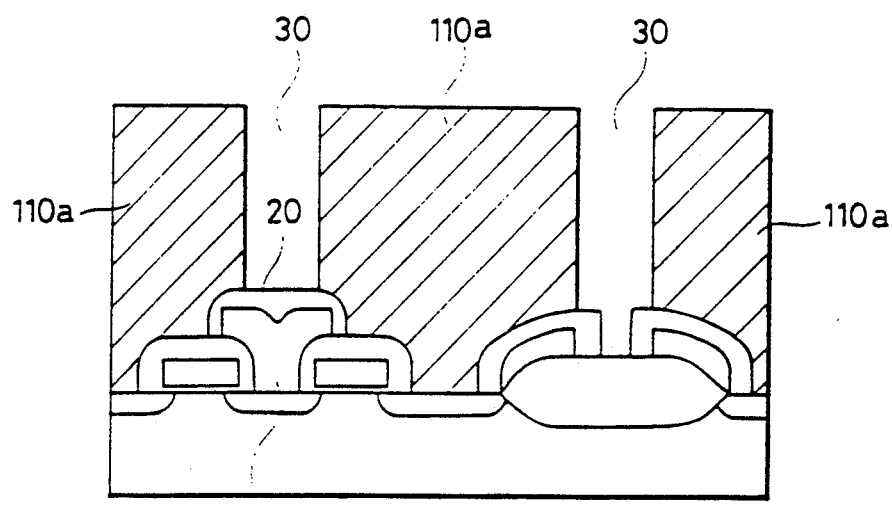

As illustrated in FIG. 7, opening regions 30 are formed in predetermined regions of polycrystalline silicon layer 110 by using a photolithography method and an etching method. Opening regions 30 divides polycrystalline silicon layer 110 into independent regions 110a to be the lower electrodes 11 of respective capacitors.

Figure 8:
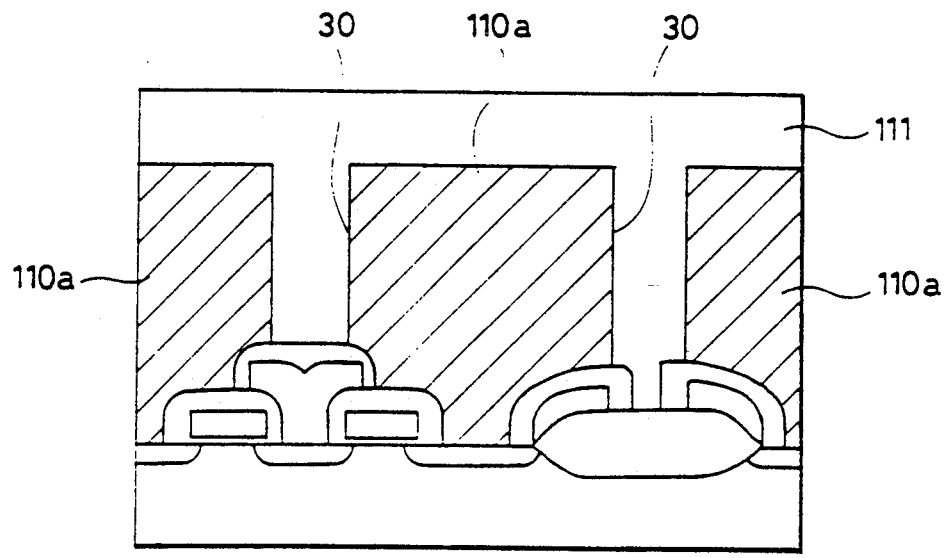

As illustrated in FIG. 8, an insulating layer 111 such as an oxide film is formed on the surfaces of polycrystalline silicon layers 110a and in the opening region 30 by using a CVD method.

Figure 9:
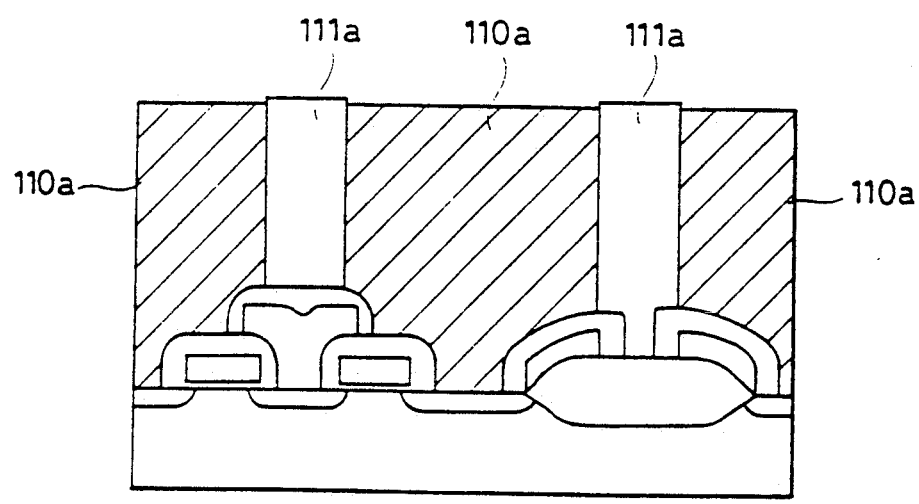

Then, as illustrated in FIG. 9, insulating layer 111 is etched to expose the surfaces of polycrystalline silicon layers 110a.

Figure 10:
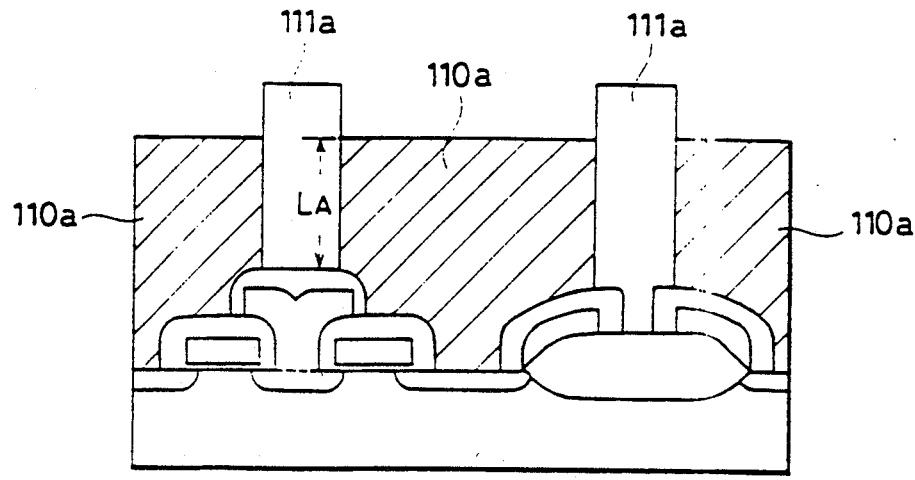

As illustrated in FIG. 10, polycrystalline silicon layers 110a to be lower electrodes are etched away to a predetermined depth. The level of the surface of polycrystalline silicon layer 11a which is etched finally becomes the same as the level of the upper end surface of lower electrodes 11 of the capacitor. For example, it is formed so that the height $L_A$ indicated in the drawing is approximately 0.5–1 μm. In the step of etching, insulating layers 111a are left protruding from the surfaces of polycrystalline silicon layers 110a by selectivity of etching.

Figure 11:
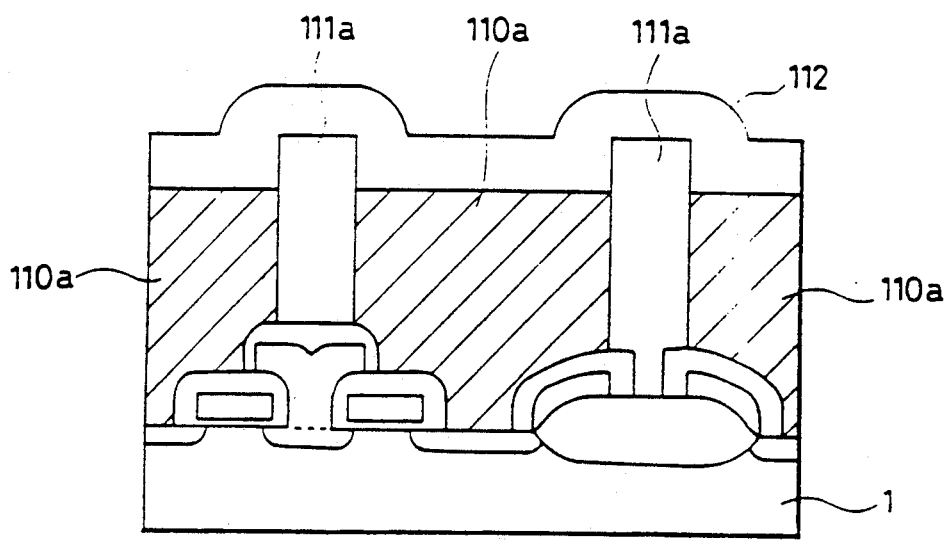

Next, as illustrated in FIG. 11, an insulating film 112 such as an oxide film is deposited on the surfaces of insulating layers 111a and polycrystalline silicon layers 110a by using a CVD method.

Figure 12:
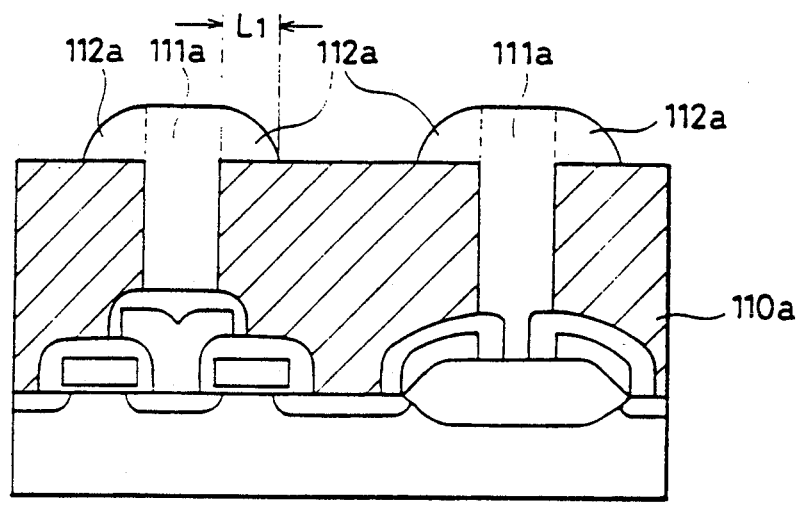

As illustrated in FIG. 12, an anisotropic etching is carried out on insulating layer 112 to leave sidewall insulating layers 112a only on the sidewalls of insulating layers 111a. The length $L_1$ of sidewall insulating layers 112a covering the surface of polycrystalline silicon layer 110a is approximately equal to the thickness of insulating layer 112 on the occasion of depositing. Accordingly, it is possible to adjust the length L, of sidewall insulating layers 112a by adjusting the thickness of insulating layer 112 on the occasion of depositing.

Figure 13:
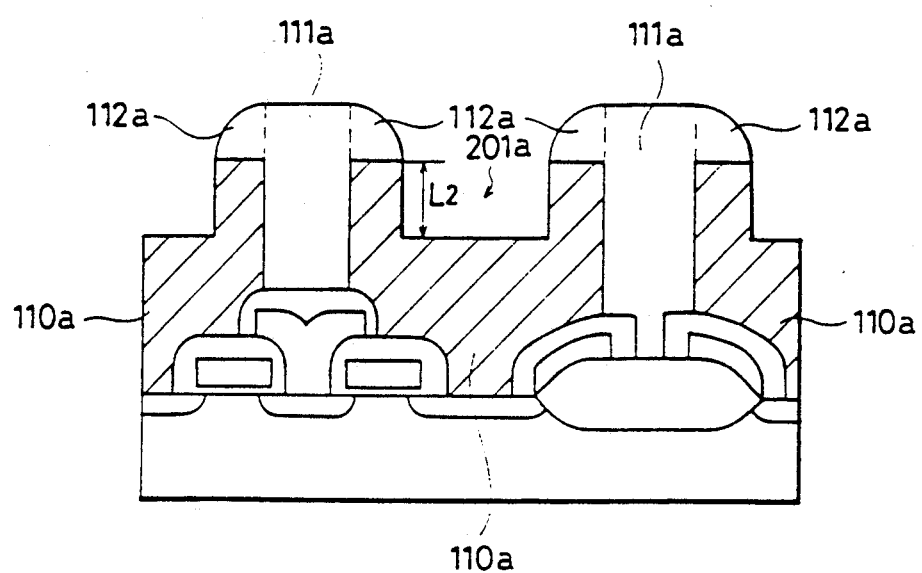

Then, as illustrated in FIG. 13, polycrystalline silicon layers 110a are etched by using insulating layers 111a and 112a as a mask to form a concave parts 201a having the depth $L_2$. Anisotropic etching such as reactive anisotropic etching is used for etching.

Figure 14:
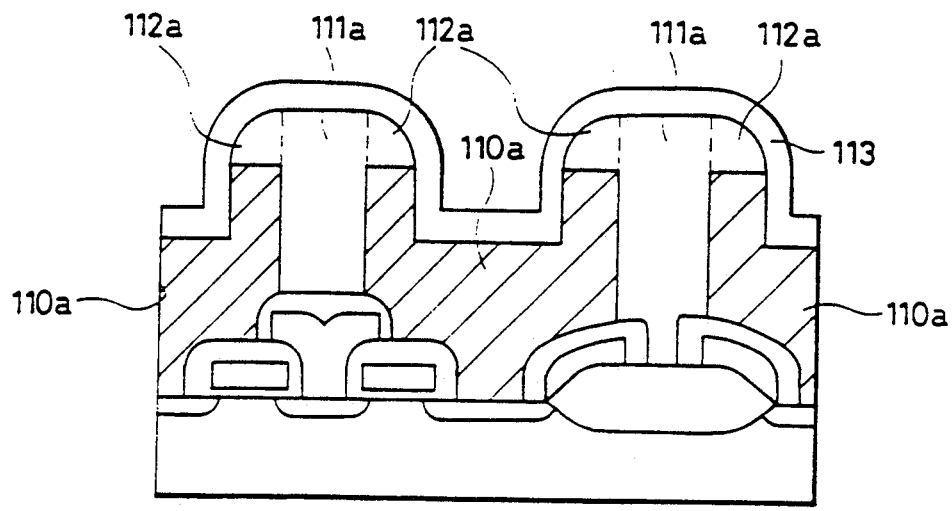

As illustrated in FIG. 14, an insulating layer 113 such as an oxide film is deposited on the whole surface using a CVD method.

Figure 15:
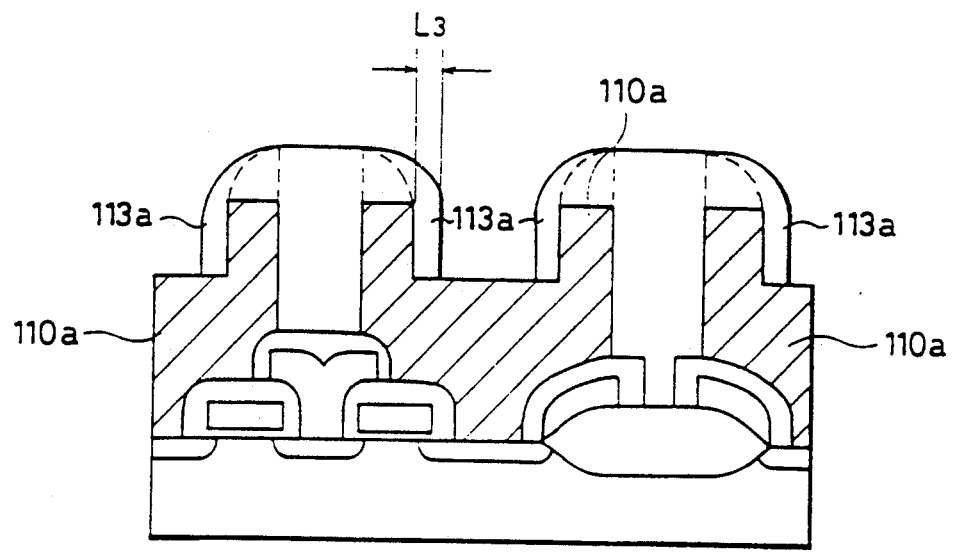

Then, as illustrated in FIG. 15, sidewall insulating layers 113a are left only on the sidewalls of concave parts of polycrystalline silicon layers 110a by carrying out anisotropic etching on insulating layer 113. The length $L_3$ of sidewall insulating layers 113a covering the surfaces of polycrystalline silicon layers 110a is approximately equal to the thickness of insulating layer 113 on the occasion of depositing it.

Figure 16:
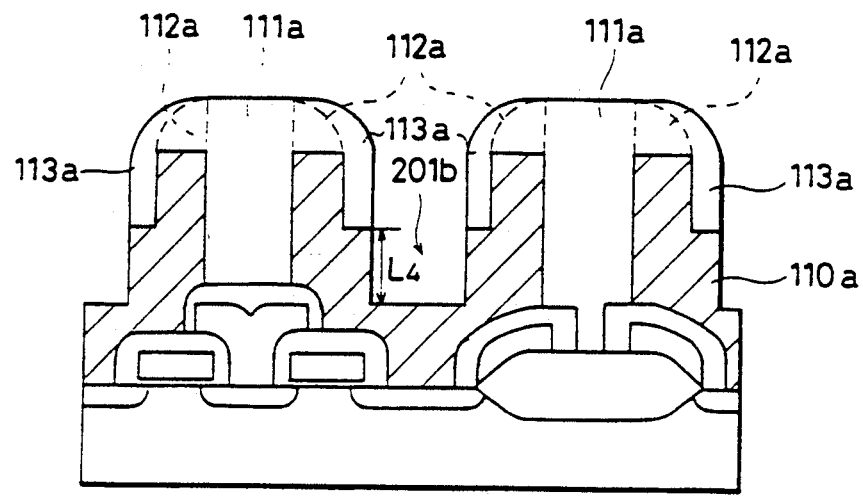

Then, as illustrated in FIG. 16, anisotropic etching is carried out on polycrystalline silicon layers 110a using sidewall insulating layers 113a as a mask at this time. Thus a further concave part 201b having the depth $L_4$ is formed. The step of forming further concave part 201b is an optional step.

Figure 17:
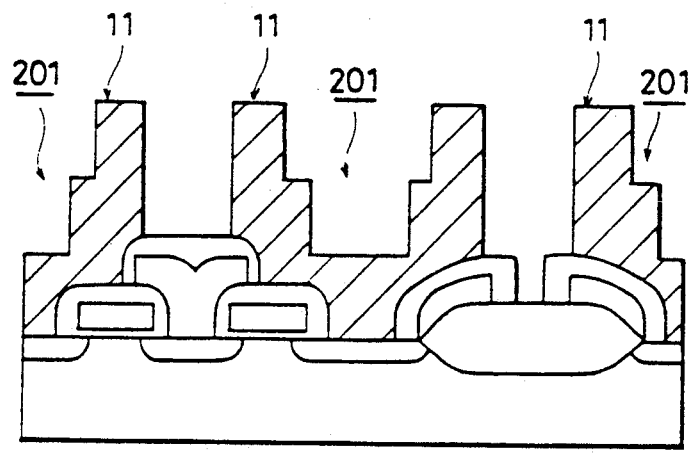

Subsequently, as illustrated in FIG. 17, insulating layers 111a, 112a, and 113a are etched away. Lower electrodes 11 having concave parts 201 of a stepped configuration on their inner peripheral surfaces are formed by the above-described steps.

Figure 18:
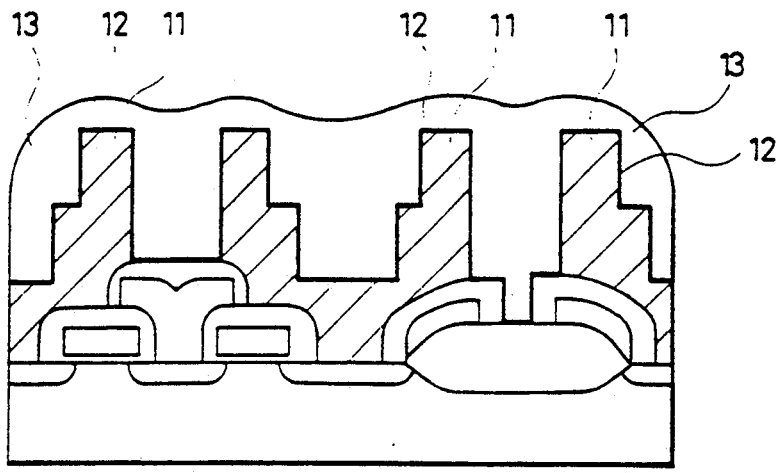

Furthermore, as illustrated in FIG. 18, a dielectric layer 12 including an oxide film, a nitride film, or a composite film of an oxide film and a nitride film is formed on the surface of lower electrodes 11. An upper electrode 13 including polycrystalline silicon is formed on their surfaces.

Figure 19:
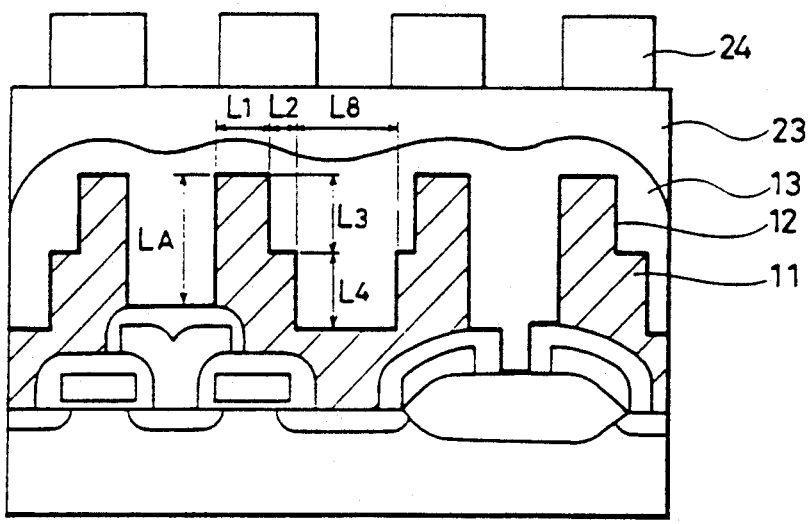

Then, as illustrated in FIG. 19, the surface of upper electrode 13 is covered with an interlayer insulating layer 23. Interconnecting layers 24 are formed on the surface of interlayer insulating layer 23 by using a photolithography method and an etching method. The memory cell illustrated in FIG. 1 is completed by the above-described steps.

As described above, the respective lengths $L_A$, $L_1$, $L_2$, $L_3$, $L_4$ and $L_B$ of capacitance regions of lower electrodes 11 illustrated in FIG. 19 are defined by respective different steps of manufacturing. Accordingly, it is possible to easily select respective sizes in accordance with necessary capacitance of the capacitor.

Now, a second embodiment of the present invention will be described. In a lower electrode 11 of a capacitor according to the second embodiment, the corner part of the inner peripheral surface of a second part 11b having a vertical wall shape is formed into a curve surface having a small curvature. A dielectric layer 12 is formed along the inner peripheral surface. Completeness of covering by thin dielectric layer 12 formed on the inner peripheral surface of vertical wall part 11b of lower electrode 11 is improved by forming it in a curve surface. Specifically, it is possible to prevent the problem that completeness of covering by the dielectric layer is degraded at the angular part to make the thickness of the film not uniform by forming such a curve surface.

Figure 20:
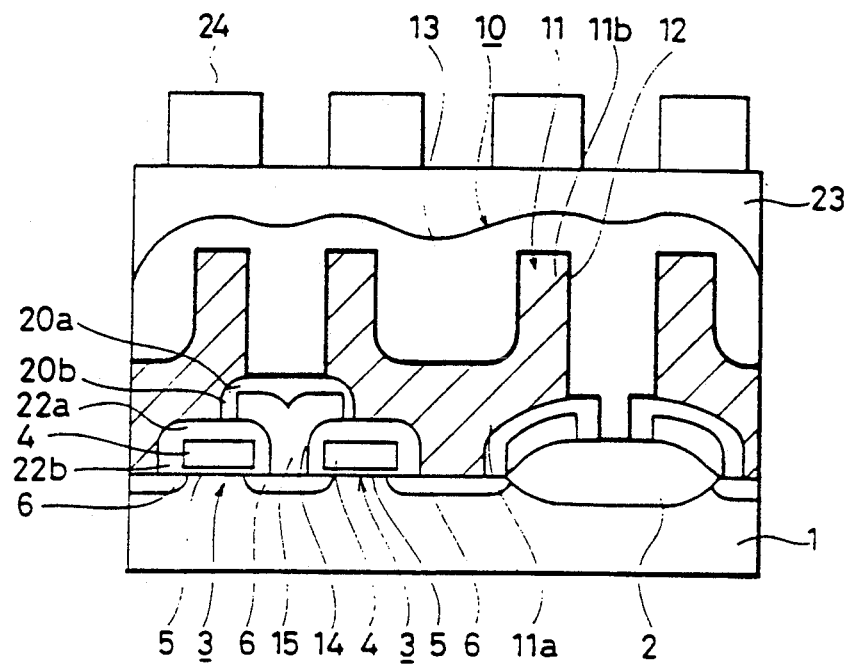
FIG. 20 is a sectional view of a structure of a memory cell in a DRAM according to a second embodiment of the present invention.

Now, the steps of manufacturing the memory cell illustrated in FIG. 20 will be described. The steps in the first embodiment illustrated in FIGS. 3-13 may be also applied to the second embodiment. The steps succeeding those steps will be described in the following.

Figure 21:
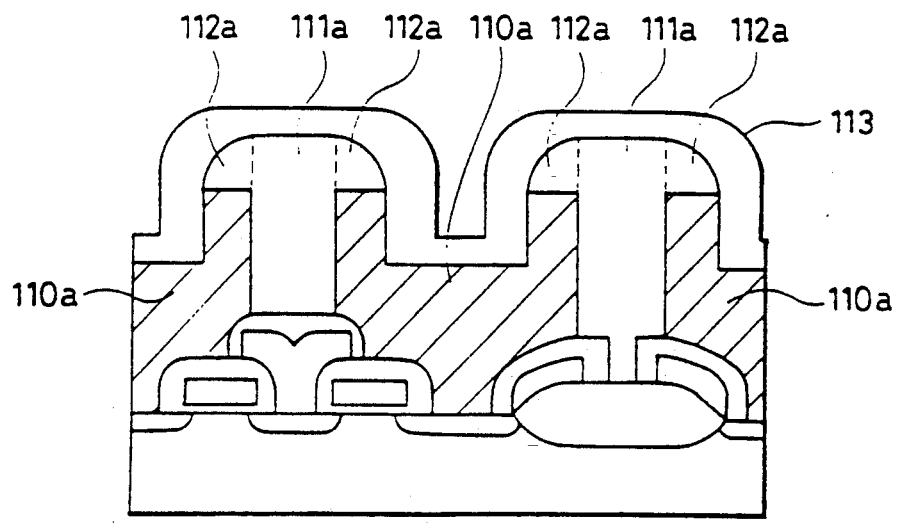
FIGS. 21-25 are sectional views of a structure of the memory cell illustrated in FIG. 20 illustrating sequential steps of manufacturing the memory cell.

First, as illustrated in FIG. 21, an insulating layer 113 such as an oxide film is formed by using a CVD method on the surfaces of insulating layers 111a, 112a formed as mask layers for etching and polycrystalline silicon layers 110a each having a concave part formed by using these mask layers.

Figure 22:
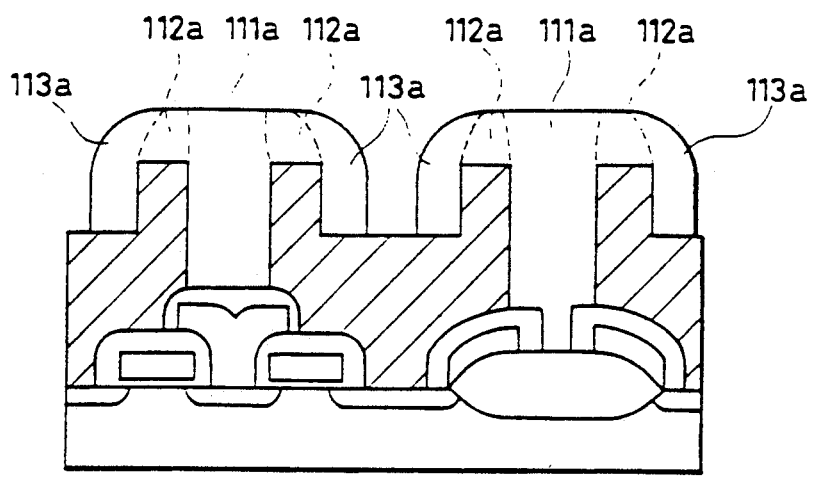

Then, as illustrated in FIG. 22, anisotropic etching is carried out on insulating layer 113 to form sidewall insulating layers 113a.

Figure 23:
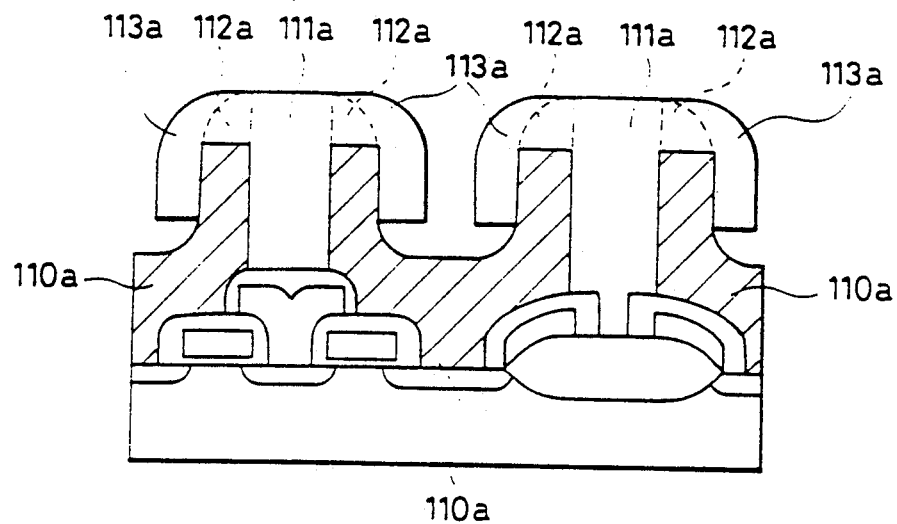

As illustrated in FIG. 23, polycrystalline silicon layers 110a constituting the lower electrode is etched by isotropic etching by using insulating layers 111a, 112a, and 113a as a mask. The polycrystalline silicon layer in the region not covered with the insulating layer and part of the polycrystalline silicon layer underlying sidewall insulating layer 113a are removed by etching.

Figure 24:
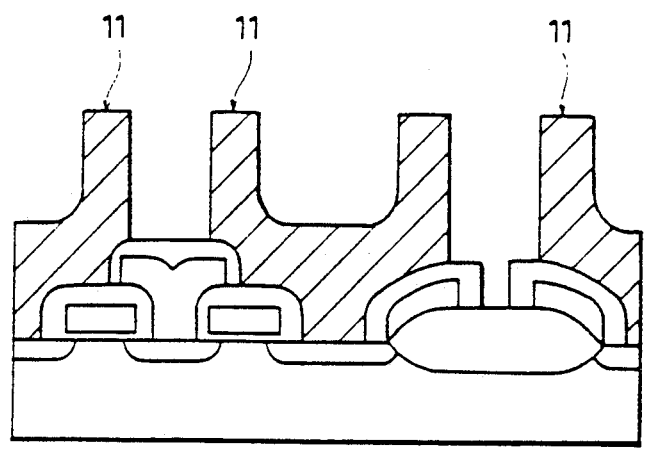

Subsequently, as illustrated in FIG. 24, insulating layers 111a, 112a, and 113a are etched away. This completes a lower electrode 11 of a capacitor.

Figure 25:
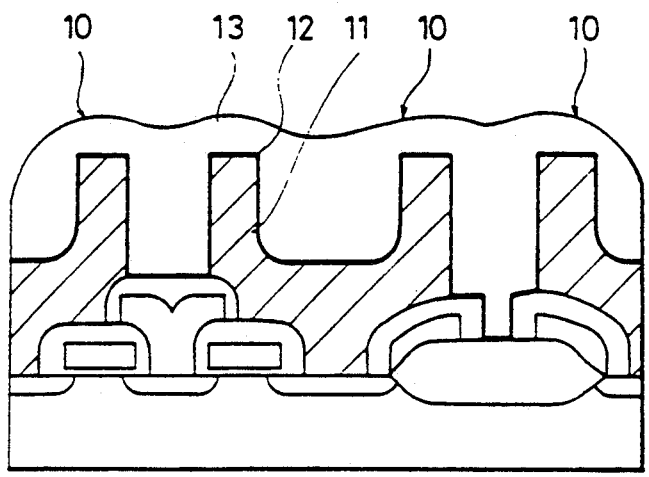

Then, as illustrated in FIG. 25, a dielectric layer 12 and an upper electrode 13 are formed on the surface of lower electrode 11.

Furthermore, as illustrated in FIG. 25, an interlayer insulating layer 23 is formed on the surface of upper electrode 13. An interconnection pattern 24 of a prescribed configuration is formed on the surface of interlayer insulating layer 23. The memory cell illustrated in FIG. 20 is completed by the above-described steps.

A third embodiment according to the present invention will be described. The characteristic point of the third embodiment is that a lower electrode 11 of a capacitor includes step parts 11c, 11d formed on the inner peripheral surface and the outer peripheral surface of a second part 11b having a vertical wall shapes. The area between opposed electrodes of the capacitor is increased to increase capacitance of the capacitor by forming step parts in the inner and outer surfaces of second part 11b of lower electrode 11.

Figure 26:
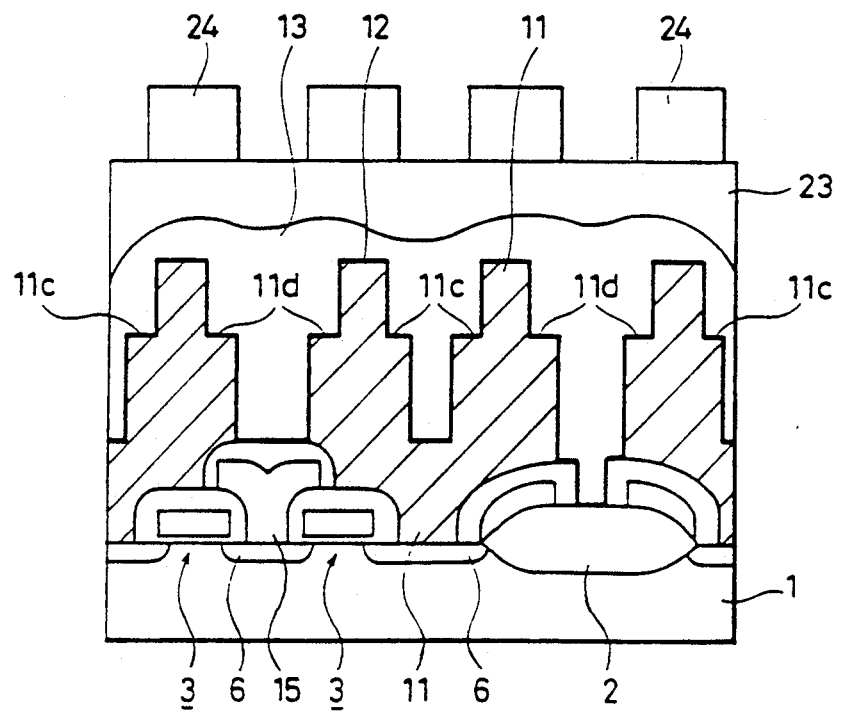
FIG. 26 is a sectional view of a structure of a memory cell in a DRAM according to a third embodiment of the present invention.
Figure 27:
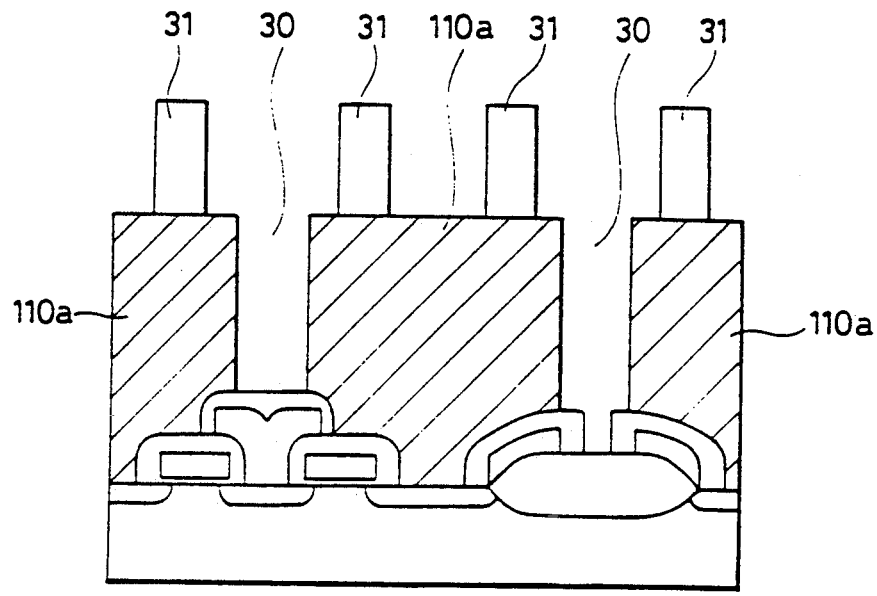
FIGS. 27-32 are sectional views of the structure of the memory cell illustrated in FIG. 26 illustrating sequential steps of manufacturing the memory cell.

Now, main steps of manufacturing the memory cell illustrated in FIG. 26 will be described. The steps in the first embodiment illustrated in FIGS. 3-7 are also applicable to the embodiment. As illustrated in FIG. 27, following the step illustrated in FIG. 7, a resist pattern 31 is formed by using a photolithography method and an etching method on the surface of a polycrystalline silicon layer 110a to be a lower electrode surrounded by an opening region 30.

Figure 28:
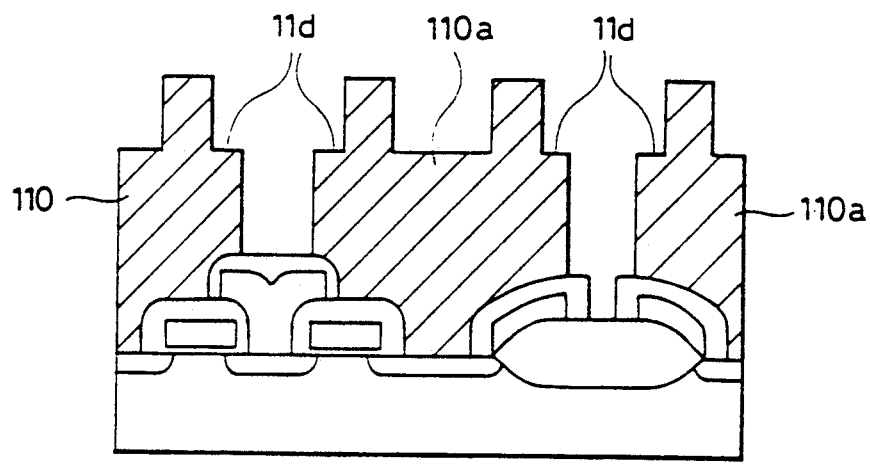

Then, as illustrated in FIG. 28, polycrystalline silicon layer 110a is etched away to a predetermined depth by anisotropic etching with resist pattern 31 as a mask. This causes concave and convex parts to be formed on the surface of polycrystalline silicon layer 110a.

Figure 29:
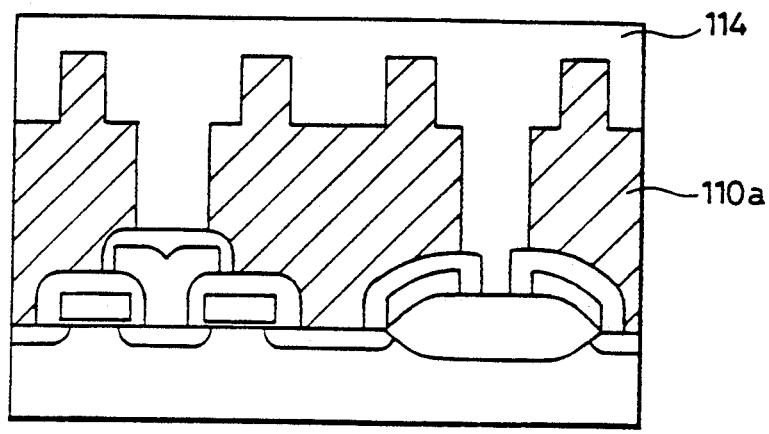

As illustrated in FIG. 29, an insulating layer 114 such as an oxide film is deposited on the whole surface by using a CVD method.

Figure 30:
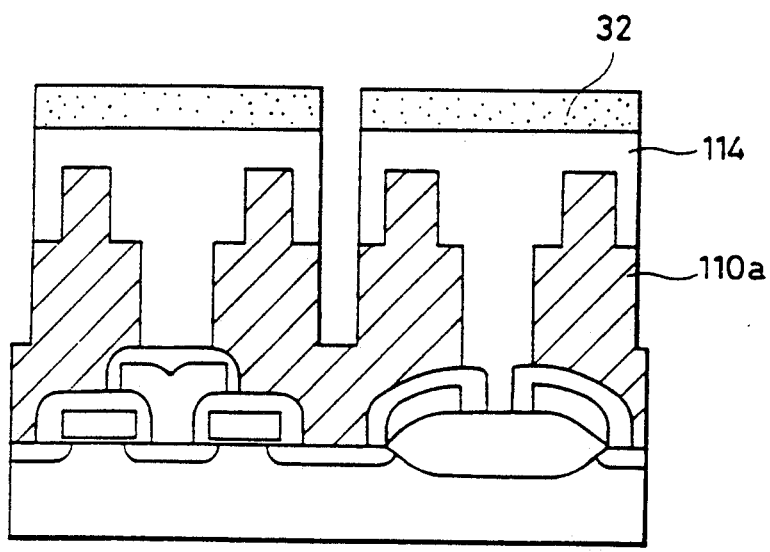

As illustrated in FIG. 30, a resist pattern 32, which has having an opening only in the region of lower electrode 11 where a concave part should be formed, is formed on the surface of insulating layer 114 by using a lithography method. Then, insulating layer 114 and polycrystalline silicon layer 110a are etched with resist pattern 32 as a mask.

Figure 31:
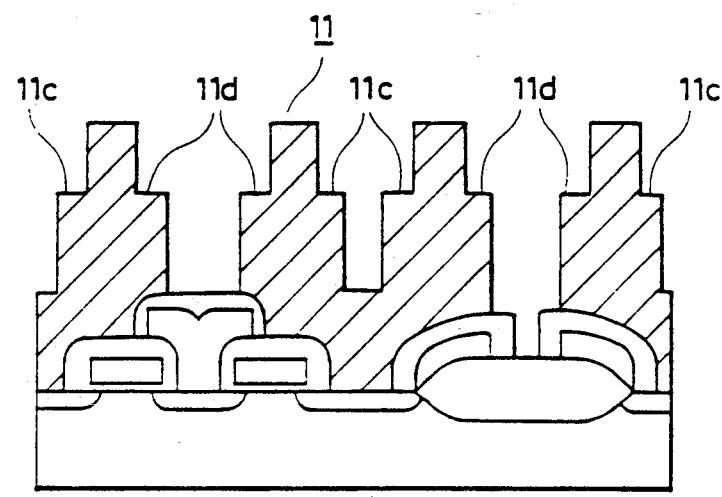

Subsequently, as illustrated in FIG. 31, resist pattern 32 and insulating layer 114 are removed. This step completes a lower electrode 11 of a capacitor. Stepped surfaces 11c, 11d are formed on the inner and outer periphery of lower electrode 11 of the capacitor.

Figure 32:
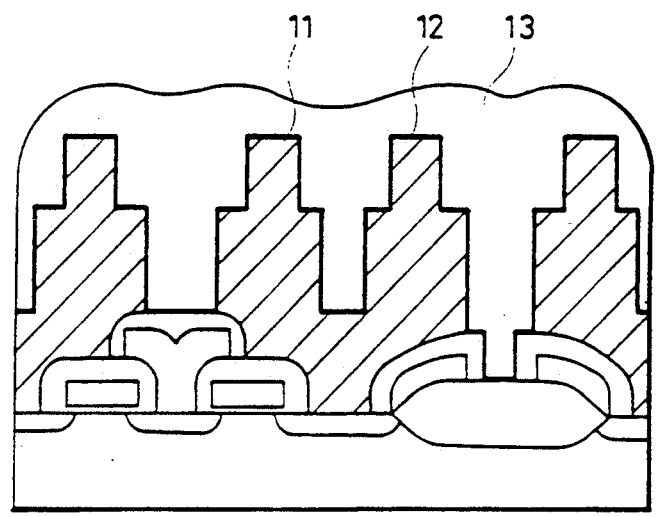

Then, as illustrated in FIG. 32, a dielectric layer 12 and an upper electrode 13 are formed on the surface of lower electrode 11.

The surface of upper electrode 13 is covered with an interlayer insulating layer 23, and then an interconnecting layer 24 is formed. The above-described steps complete the memory cell illustrated in FIG. 26.

According to the first to the third embodiments described above, an integral lower electrode 11 having steps on the inner and outer periphery of itself is formed by partially removing a thickly formed polycrystalline silicon layer by using an etching method. According to the first and the second embodiments, the stepped configuration is formed by a self-alignment method using a sidewall insulating layer formed by anisotropic etching as a mask. Accordingly, the manufacturing method is simplified by omitting the complicated mask steps. Furthermore, while the case where one or two steps are formed on the inner peripheral surface of the lower electrode of capacitor 11 has been described in the above-described embodiments, it is possible to form more step parts by repeating the etching process using the sidewall insulating film as a mask a plurality of times.

Furthermore, the material for the lower electrode of the capacitor is not limited to polycrystalline silicon, and for example, a metal layer and so on may be used. In addition, a ferroelectric material or the like, for example, may be used as the dielectric layer.

As described above, a structure of a capacitor in a DRAM according to the present invention can realize a capacitor in which the area between opposed electrodes is increased by making hollow the inner part of a lower electrode protruding on an insulating layer by etching to form a concave part for constituting an integrally formed lower electrode.

A conductive layer constituting the lower electrode of the capacitor is integrally formed by an etching method using an etching mask, so that it is possible to manufacture a capacitor having increased capacitance by a simple manufacturing process. Furthermore, a sidewall insulating layer formed by using anisotropic etching is used as an etching mask, so that it is possible to manufacture the capacitor in a self-alignment manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A storage element for a DRAM, comprising:

a semiconductor substrate of a first conductivity-type including an impurity region of a second conductivity-type formed therein;

an insulating layer formed on a main surface of said semiconductor substrate and having an opening which reaches said impurity region; and a capacitor comprising a seamless lower electrode layer including a first part formed along the surface of said insulating layer to be connected through said opening to said impurity region and a second part formed integrally protruding upward from the surface of said first part and having an upper planar surface parallel to said substrate, a dielectric layer formed on the surface of said lower electrode layer, and an upper electrode layer of the capacitor formed on the surface of said dielectric layer.

2. A storage element for a DRAM, comprising:

a semiconductor substrate of a first conductivity-type including an impurity region of a second conductivity-type formed therein;

an insulating layer formed on a main surface of said semiconductor substrate and having an opening which reaches said impurity region;

a capacitor comprising a lower electrode layer including a first part formed along the surface of said insulating layer to be connected through said opening to said impurity region and a second part formed integrally protruding upward from the surface of said first part and having an upper planar surface parallel to said substrate, at least one of the inner and outer sidewall surfaces of said second part having a stepped region characterized by vertical and horizontal adjoining portions, said second part surrounding a space whose section taken along a line perpendicular to the main surface of said semiconductor substrate having an axially symmetrical configuration, a dielectric layer formed on the surface of said lower electrode layer, and an upper electrode layer of the capacitor formed on the surface of said dielectric layer.

3. A storage element for a DRAM, comprising:

a semiconductor substrate of a first conductivity-type having a main surface and including an impurity region of a second conductivity-type formed therein;

an insulating layer formed on the main surface of said semiconductor substrate and having an opening which reaches said impurity region;

a capacitor comprising
  (a) a seamless lower electrode layer including a first part formed along the surface of said insulating layer to be connected through said opening to said impurity region and a second part protruding upward from the surface of said first part to surround side surfaces of a space whose section taken along a line perpendicular to the main surface of said semiconductor substrate has an axially symmetrical configuration,
  (b) a dielectric layer formed on the surface of said lower electrode layer, and
  (c) an upper electrode layer formed on the surface of said dielectric layer.

4. A charge storage element for a DRAM connected to impurity regions formed on a main surface of a semiconductor substrate having impurity regions formed therein, comprising:

(A) a first conductive layer made by
  (a) forming a first insulating layer on the main surface of said semiconductor substrate with an opening which reaches said impurity regions;
  (b) forming a first conductive layer on the surface of said first insulating layer and inside said opening;
  (c) forming an opening region on the periphery of a region of said first conductive layer to be a lower electrode of one stacked capacitor to reach said first insulating layer;
  (d) forming a second insulating layer in said opening region;
  (e) etching said first conductive layer so that the upper part of said second insulating layer protrudes from the surface of said first conductive layer;
  (f) forming a sidewall insulating layer on the side surface of said second insulating layer protruding from the surface of said first conductive layer;
  (g) etching said first conductive layer using said sidewall insulating layer as a mask to form a concave part in the inner part of said first conductive layer; and
  (h) removing said second insulating layer and said sidewall insulating layer;
(B) a dielectric layer on the surface of said first conductive layer; and
(C) a second conductive layer on the surface of said dielectric layer.

5. A charge storage element for a DRAM connected to impurity regions formed on a main surface of a semiconductor substrate having impurity regions formed therein, comprising:
(A) a first conductive layer made by
  (a) forming a first insulating layer on a main surface of a semiconductor substrate including impurity regions formed therein to have an opening which reaches said impurity region;
  (b) forming a first conductive layer on the surface of said first insulating layer and inside said opening;
  (c) forming an opening region which reaches said first insulating layer on the periphery of a region of said first conductive layer to be a lower electrode of one stacked capacitor;
  (d) selectively forming a mask layer for etching on the surface of said first conductive layer surrounded by said opening region; and
  (e) etching said first conductive layer using said mask layer for etching as a mask to form a concave part in the surface of said first conductive layer;
(B) a dielectric layer on the surface of said first conductive layer; and
(C) a second conductive layer on the surface of said dielectric layer.

6. A storage element for a DRAM comprising:

a semiconductor substrate of a first conductivity-type including an impurity region of a second conductivity-type formed therein;

an insulating layer formed on a main surface of said semiconductor substrate and having an opening which reaches said impurity region;

a capacitor comprising a lower electrode layer including a first part formed along the surface of said insulating layer to be connected through said opening to said impurity region and a second part formed integrally protruding upward from the surface of said first part to surround side surfaces of a space whose section taken along a line perpendicular to the main surface of said semiconductor substrate has an axially symmetrical configuration, a dielectric layer formed on the surface of said lower electrode layer, and an upper electrode layer of the capacitor formed on the surface of said dielectric layer.

7. The storage element according to claim 6, wherein said second part of said lower electrode layer has its thickness in a direction parallel to the main surface of said semiconductor substrate changing stepwise.

8. The storage element according to claim 7, wherein steps are formed at least on the inner peripheral surface of said second part of said lower electrode layer.

9. The storage element according to claim 7, wherein steps are formed on the inner peripheral surface and the outer peripheral surface of said second part of said lower electrode layer.

10. The storage element according to claim 6, wherein a region connecting the internal peripheral surface of said second part of said lower electrode layer and the surface of said first part includes a curve surface.

11. The storage element according to claim 6, wherein the surface of said first part exposed in the bottom part of a concave part of said lower electrode layer surrounded by said second part is formed flat.

12. A DRAM comprising:
a first conductivity-type semiconductor substrate having a main surface and an element isolating region formed on the main surface thereof;
a plurality of word lines extending in a prescribed direction on said main surface of said semiconductor substrate;
a plurality of bit lines extending in a direction crossing said word lines;
a plurality of memory cells formed on said main surface of said semiconductor substrate in a vicinity of a crossing portion of said word lines and said bit lines;
each of said plurality of memory cells comprising
an access transistor having a pair of second conductivity-type impurity regions formed on said main surface of said semiconductor substrate at a prescribed distance therefrom, and a gate electrode formed on said main surface between said impurity regions with a gate insulating film interposed, and
a capacitor comprising a lower electrode layer including a first part formed along the surface of an insulating layer covering at least said gate electrode of said access transistor and connected through an opening formed in said insulating layer to one of said impurity regions of said access transistor and a second part formed integrally protruding upward from the surface of said first part to surround side surfaces of a space whose section taken along a line perpendicular to the main surface of said semiconductor substrate has an axially symmetrical configuration, a dielectric layer formed on the surface of said lower electrode layer, and an upper electrode layer formed on the surface of said dielectric layer.

* * * * *